(12) United States Patent
Sawai

(10) Patent No.: US 11,018,063 B2
(45) Date of Patent: May 25, 2021

(54) METHOD AND APPARATUS FOR NANOSCALE-DIMENSION MEASUREMENT USING A DIFFRACTION PATTERN FILTER

(71) Applicant: SANDISK TECHNOLOGIES LLC, Addison, TX (US)

(72) Inventor: Koetsu Sawai, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 274 days.

(21) Appl. No.: 16/199,564

(22) Filed: Nov. 26, 2018

(65) Prior Publication Data
US 2020/0168513 A1 May 28, 2020

(51) Int. Cl.
| | |
|---|---|
| *H01L 21/66* | (2006.01) |
| *H01L 27/11582* | (2017.01) |
| *H01L 27/11519* | (2017.01) |
| *H01L 27/11556* | (2017.01) |
| *H01L 27/11565* | (2017.01) |
| *H01L 23/528* | (2006.01) |
| *G01R 31/26* | (2020.01) |

(Continued)

(52) U.S. Cl.
CPC .......... *H01L 22/12* (2013.01); *G01R 31/2648* (2013.01); *H01L 22/20* (2013.01); *H01L 22/30* (2013.01); *H01L 23/528* (2013.01); *H01L 23/5226* (2013.01); *H01L 27/11519* (2013.01); *H01L 27/11556* (2013.01); *H01L 27/11565* (2013.01); *H01L 27/11575* (2013.01); *H01L 27/11582* (2013.01)

(58) Field of Classification Search
CPC ..... G01R 31/2648; H01L 22/12; H01L 22/20; H01L 22/30; H01L 23/5226; H01L 23/528; H01L 27/11519; H01L 27/11556; H01L 27/11565; H01L 27/11575; H01L 27/11582

USPC .................................................. 356/614–640
See application file for complete search history.

(56) References Cited

U.S. PATENT DOCUMENTS

| | | |
|---|---|---|
| 9,876,031 B1 | 1/2018 | Shimizu et al. |
| 9,985,046 B2 | 5/2018 | Lu et al. |

(Continued)

OTHER PUBLICATIONS

U.S. Appl. No. 15/914,504, filed Mar. 7, 2018, SanDisk Technologies, LLC.

*Primary Examiner* — Tri T Ton
(74) *Attorney, Agent, or Firm* — The Marbury Law Group PLLC

(57) ABSTRACT

A measurement apparatus for measuring dimensions within a semiconductor device includes an illumination source configured to direct light onto a stage configured to hold the semiconductor device, and a detection assembly configured to receive light diffracted by the semiconductor device, in which the detection assembly includes a detector configured to receive light diffracted by the semiconductor device and determine a measurement of a periodic structure within the semiconductor device based on the received diffracted light, and a diffraction pattern filter configured to permit light diffracted by the periodic structure to be measured to reach the detector and block at least a portion of light diffracted by other structures in the semiconductor device from reaching the detector. Embodiments include methods of measuring a semiconductor device using the measurement apparatus and methods of making the diffraction pattern filter.

9 Claims, 11 Drawing Sheets

(51) Int. Cl.
*H01L 23/522* (2006.01)
*H01L 27/11575* (2017.01)

(56) References Cited

U.S. PATENT DOCUMENTS

| | | | |
|---|---|---|---|
| 2008/0144023 A1* | 6/2008 | Shibata | G01N 21/95623 |
| | | | 356/237.2 |
| 2009/0290168 A1* | 11/2009 | Hamamatsu | G01N 21/47 |
| | | | 356/600 |
| 2014/0001450 A1* | 1/2014 | Shinotsuka | H01L 51/5275 |
| | | | 257/40 |
| 2016/0041092 A1* | 2/2016 | Urano | G01N 21/95623 |
| | | | 356/237.5 |
| 2017/0358594 A1 | 12/2017 | Lu et al. | |
| 2018/0120485 A1* | 5/2018 | Oota | C09B 23/00 |
| 2018/0151497 A1 | 5/2018 | Makala et al. | |
| 2018/0299253 A1 | 10/2018 | Liu et al. | |

\* cited by examiner

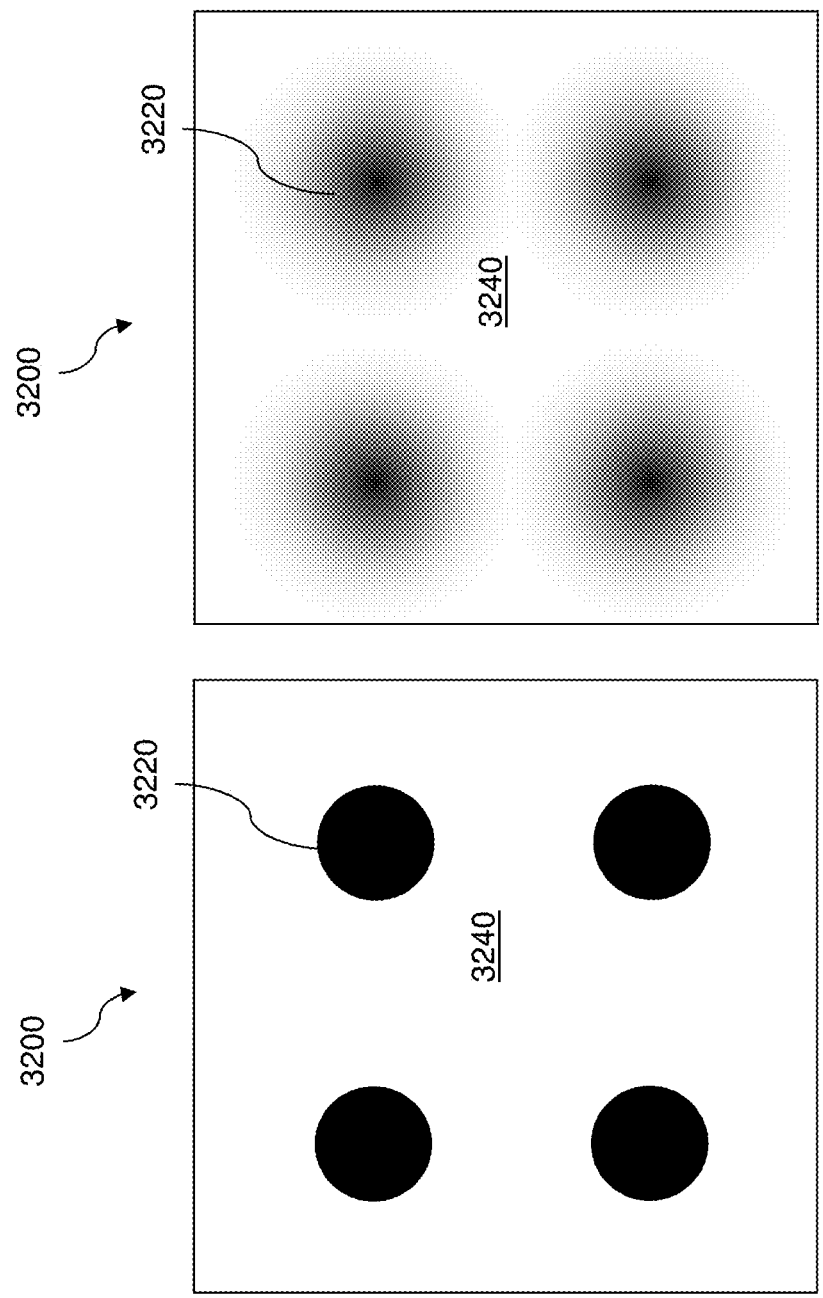

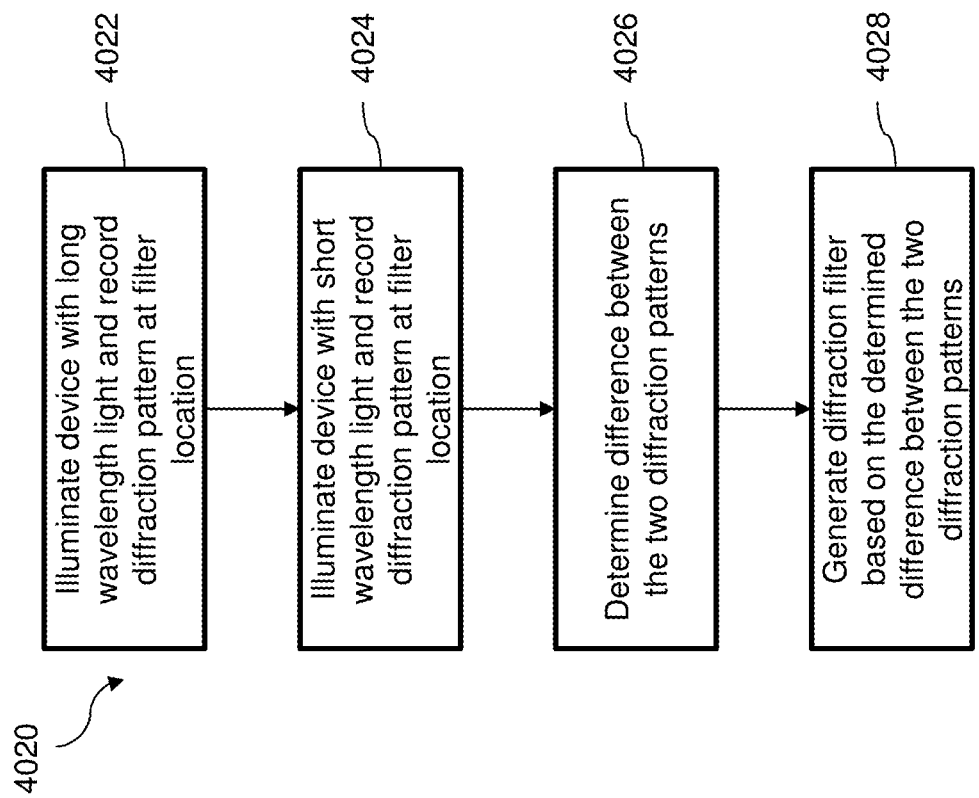

METHOD AND APPARATUS FOR NANOSCALE-DIMENSION MEASUREMENT USING A DIFFRACTION PATTERN FILTER

FIELD

The present disclosure relates generally to metrology equipment for semiconductor manufacturing, and particularly to a nanoscale-dimension measurement apparatus using a diffraction pattern filter, a method of operating the same, and a method of making a diffraction pattern filter.

BACKGROUND

Dimensions of features in a two-dimensional array of structural elements, such as memory openings, can be measured by optical methods. In such methods, an incident beam shown on the two-dimensional array of structural elements within a memory generates a diffraction pattern that reflects a magnitude of various dimensions of the structural elements, such as the average diameter of the memory openings. Inspection of the diffraction pattern can thus provide information regarding dimensions and defects within a semiconductor device, such as a memory device.

SUMMARY

According to an aspect of the disclosure, a measurement apparatus for measuring dimensions within a semiconductor device includes an illumination source configured to direct light onto a stage configured to hold the semiconductor device, and a detection assembly configured to receive light diffracted by the semiconductor device, in which the detection assembly includes a detector configured to receive light diffracted by the semiconductor device and determine a measurement of a periodic structure within the semiconductor device based on the received diffracted light, and a diffraction pattern filter configured to permit light diffracted by the periodic structure to be measured to reach the detector and block at least a portion of light diffracted by other structures in the semiconductor device from reaching the detector.

A method of measuring a dimension of a periodic structure of a semiconductor device using an optical nanoscale-dimension measurement apparatus includes placing a diffraction pattern filter within a detection assembly of the optical nanoscale dimension measurement apparatus, wherein the diffraction pattern filter is configured to permit light diffracted by the periodic structure to reach a detector within the detection assembly and block at least a portion of light diffracted by other structures in the semiconductor device from reaching the detector, illuminating the semiconductor device with light so that light diffracted from the semiconductor device is received by the detection assembly, and measuring at least one dimension of the periodic structure of the semiconductor device based on a diffraction pattern in the light diffracted from the semiconductor device.

Methods of making a diffraction pattern filter include determining a first diffraction pattern of light diffracted from a semiconductor device that includes placing opaque material on a transparent medium at locations in a diffraction pattern from structures to be measured and a diffraction pattern of light diffracted from other structures, determining a second diffraction pattern that does not include the diffraction pattern from other structures, generating a difference diffraction pattern by subtracting the second diffraction pattern from the first diffraction pattern, and forming the diffraction pattern filter by to the generated difference diffraction pattern.

BRIEF DESCRIPTION OF THE DRAWINGS

FIG. 5A is a layout of a first exemplary diffraction filter for the exemplary nanoscale-dimension measurement apparatus of FIG. 4A according to an embodiment of the present disclosure.

FIG. 5B is a layout of a second exemplary diffraction filter for the exemplary nanoscale-dimension measurement apparatus of FIG. 4A according to an embodiment of the present disclosure.

FIG. 9 is process flow diagram of a second method for generating a diffraction filter for a nanoscale-dimension measurement apparatus according to an embodiment of the present disclosure.

DETAILED DESCRIPTION

Figure 1A:
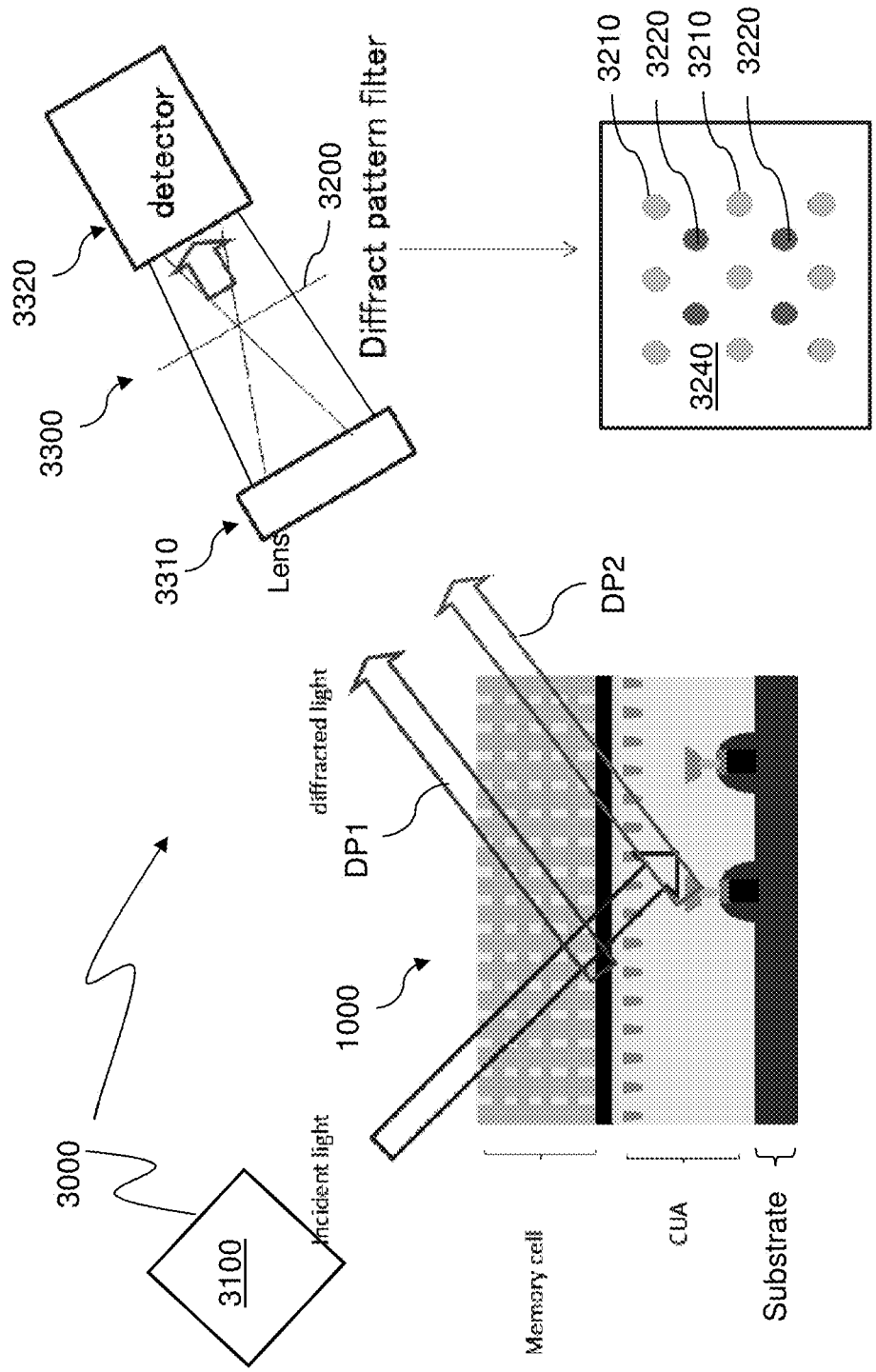
FIG. 1A is a schematic diagram of an exemplary nanoscale-dimension measurement apparatus during operation according to an embodiment of the present disclosure.

Various embodiments of the present disclosure are directed to a nanoscale-dimension measurement apparatus that includes a diffraction pattern filter that improves dimensional measurements of memory devices by removing diffraction patterns from other structures, such as background device structures, as well as methods of making and using such diffraction pattern filters. The need to scale semiconductor devices has led to the advent of the CMOS-under-array (CUA) architecture. In the CUA architecture, an array of CMOS devices is formed on a semiconductor substrate, metal interconnect structures embedded in interconnect level dielectric layers are formed over the CMOS devices, and a three-dimensional memory device is formed over the metal interconnect structures. The CMOS devices are often formed as a two-dimensional array of devices, and the three-dimensional memory device often includes a two-dimensional array of vertical stacks of memory elements (such as NAND strings). The array pattern in the underlying CMOS array compromises optical measurements of memory structures by adding diffraction patterns to the optical interference signal resulting from the two-dimensional array of features within three-dimensional memory device being measured. Various embodiments of the disclosure improve optical dimension measurement tools for measuring dimensions of nanoscale array structures of three-dimensional memory devices by using a diffraction pattern filter to suppress additional optical signals generated from the underlying CMOS device structures.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, a "dielectric material" refers to a material having electrical conductivity less than $1.0 \times 10^{-6}$ S/cm. All measurements for electrical conductivities are made at the standard condition.

Referring FIG. 1A, an exemplary optical nanoscale-dimension measurement apparatus 3000 according to an embodiment of the present disclosure is schematically illustrated during operation. As used herein, a nanoscale dimension refers to a dimension in a range from 1 nm to 1,000 nm. The exemplary optical nanoscale-dimension measurement apparatus 3000 is an optical dimension measurement tool. The optical nanoscale-dimension measurement apparatus 3000 can be configured to detect and analyze an interference pattern generated by shining light on a two-dimensional periodic array of unit structures as are typical and memory devices to measure nanoscale dimensions, such as average dimension of a geometrical feature within the unit structures. For example, the optical nanoscale-dimension measurement apparatus 3000 can be configured to measure an average size of memory openings within a two-dimensional array of memory openings in a three-dimensional memory device. Alternatively, the exemplary nanoscale-dimension measurement apparatus can be configured to measure an average step length or an average step width of stepped surfaces that manifests periodic repetitions of vertical steps in a three-dimensional memory device.

The optical nanoscale-dimension measurement apparatus 3000 is shown examining a semiconductor device 1000 including a CMOS-under-array (CUA) structure and an overlying in-process three-dimensional memory cell. As used herein, an "in-process" element refers to an element that is subsequently modified in structure or composition during manufacture. The in-process three-dimensional memory device is a device under manufacture, and subsequent processing steps are performed to modify the in-process three-dimensional memory device into a functional three-dimensional memory device. For example, the in-process three-dimensional memory device may include a two-dimensional array structure of memory openings that will be filled with memory opening fill structures that include memory stack structures during subsequent processing operations.

Certain dimensions of features of an in-process three-dimensional memory device may be measured during manufacture of the three-dimensional memory device. Such measured dimensions can include, for example, the average lateral dimension of memory openings and average step width of stepped surfaces that are subsequently used as contact areas for word lines. The in-process three-dimensional memory device 1000 with underlying CUA structures can be mounted on an optical measurement tool 3000 equipped with an illumination source 3100 and an optical measurement apparatus 3000 of an embodiment of the present disclosure.

The optical measurement apparatus 3000 of various embodiments includes an illumination source 3100 configured to emit an incident light to illuminate a target semiconductor device 1000 (e.g., a memory device) that is mounted on a stage, i.e., a target mount.

The target semiconductor device 1000 may be an in-process three-dimensional memory device. The incident light emitted by the illumination source 3100 may have a continuous spectrum extending over the visible spectrum (i.e., the wavelength ranges from 400 nm to 800 nm) and optionally may include an infrared range and/or an ultraviolet range.

The optical measurement apparatus 3000 includes a detection assembly 3300 positioned within the optical measurement tool 3000 and configured to receive light diffracted by the semiconductor device 1000. The detection assembly 3300 includes a lens 3310 configured to focus received diffracted light on an optical detector 3220 that is configured to detect diffracted light emitted from the semiconductor device 1000 upon illumination by the incident light and determine a measurement of a periodic structure within the semiconductor device based on the received diffracted light. The optical detector 3320 may be configured to determine the spectrum of detected radiation over the entire wavelength range of the incident light. The detection assembly 3300 and/or the optical detector 3320 can move with respect to the stage, i.e., the location of the semiconductor substrate 1000.

The semiconductor device 1000 includes a device array structure from which measurement of geometrical features is desired, which is sometimes referred to herein as a target device array. The semiconductor device 1000 can include other structures that will generate diffraction patterns in the measurement apparatus but that are not relevant to the geometrical features to be measured. In particular, such other structures can be located at an underlying level, such as CMOS-under array structures, which are also referred to herein as background device structures. CMOS-under-array (CUA) background device structures can include complementary metal-oxide-semiconductor (CMOS) devices located on a top surface of a semiconductor substrate and metal interconnect structures embedded within interconnect-level dielectric material layers that overlie the CMOS devices and electrically connected to the CMOS devices. Background device structures can include CMOS devices located on a top surface of the first substrate and metal interconnect structures located over the CMOS devices. The CMOS devices can include peripheral (e.g., driver circuit) devices, such as sense amplifier or other driver circuit devices, that are used for operation of the first device array structure upon completion of a manufacturing process in a functional semiconductor chip. The metal interconnect structures can be used to electrically connect the CMOS devices to the various components of the first device array. The first device array structure can become a three-dimensional memory array upon completion of the manufacturing process. For example, a three-dimensional memory array can include a three-dimensional NAND array.

As illustrated in FIG. 1A, a first fraction of the incident light from the illumination source 3100 is diffracted from the array of two-dimensional periodic structures overlying the CUA structures to generate a first diffraction pattern DP1 that contains information about geometrical features of the array of two-dimensional periodic structures to be measured (i.e., the target array structure). A second fraction of the incident light from the illumination source 3100 may be diffracted from the underlying CUA structures to generate a second diffraction pattern DP2 that contains information about geometrical features of the CUA structure. Without a diffraction filter of the various embodiments, both the first diffraction pattern DP1 and the second diffraction pattern DP2 will be measured by the detector 3320.

Information obtained from the optical measurement apparatus 3000 regarding the geometrical features of the two-dimensional periodic structures is what is used during the processing steps that form the three-dimensional memory device over the CUA structure. Only the first diffraction pattern DP1 includes the information about the geometrical features of the two-dimensional periodic structures to be measured. The second diffraction pattern DP2 includes information about other structures, including underlying features or background device structures, but nothing about the geometrical features of the two-dimensional periodic structures to be measured. The optical signal received by the detection assembly 3300 is the combination of the first diffraction pattern DP1 of the structure to be measured and the second diffraction pattern DP2 of other structures, such as background device structures. Thus, the second diffraction pattern DP2 from the background device structures becomes a source of noise interfering with measurement of certain dimensions of the target semiconductor device 1000 using the first diffraction pattern DP1 because the optical detector 3320 is not capable of separating the second diffraction pattern DP2 from the first diffraction pattern DP2.

FIG. 1A also shows a representation of the first and second diffraction patterns DP1, DP2 as they would appear at the location in the detection assembly 3300 where the diffraction filter 3200 would be positioned, e.g., with respect to the lens 3310. At this location, the first diffraction pattern DP1 generated by the two-dimensional periodic structures within the semiconductor device 1000 to be measured may appear as a regular sequence of spots of light 3210 (i.e., locations where the diffracted light has an increased intensity), while the second diffraction pattern DP2 generated by other structures (e.g., background device structures) may appear as regular sequence of spots of light 3220 in different locations.

Figure 1B:
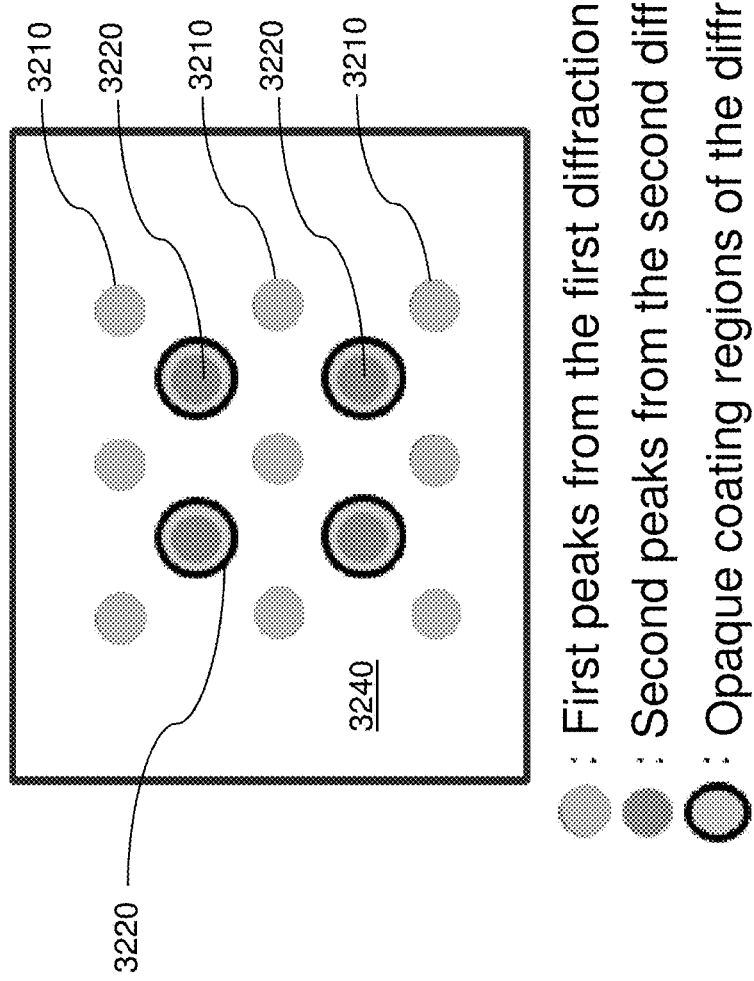
FIG. 1B is a schematic of a diffraction pattern as it would appear at the location of a diffraction filter in the exemplary nanoscale-dimension measurement apparatus of FIG. 1A.

According to an aspect of the present disclosure, a diffraction pattern filter 3200 is inserted into the detection assembly 3300 in front of the detector 3320. The diffraction pattern filter 3200 is configured to permit light diffracted by the periodic structure to be measured (i.e., the first diffraction pattern DP1 usable for measuring certain dimensions of the semiconductor device 1100) to reach the detector, and block at least a portion of light diffracted by other structures in the semiconductor device (i.e., the second diffraction pattern DP2 from other structures) from reaching the detector 3320. FIG. 1B stylistically illustrates the first and second diffraction patterns as they would appear where the diffraction pattern filter 3200 would be positioned within the detection assembly 3300, particularly with respect to the lens 3310. At this location in the detection assembly 3300, the optical pattern formed by the diffracted light from the semiconductor substrate 1000 includes areas of high intensity of the diffracted light from the first diffraction pattern DP1 illustrated as first peaks 3210 and the second diffraction pattern DP2 illustrated as second peaks 3220. In some embodiments, the diffraction pattern filter 3200 is positioned at or near a focal point of the lens 3210 as illustrated in FIG. 1A.

FIG. 1B also illustrates how a diffraction pattern filter 3200 comprises a pattern of opaque material 3230 on or in a transparent substrate 3240 at locations coincident with the second peaks 3320 of the second diffraction pattern DP2. So positioned, the pattern of opaque material 3230 will prevent diffracted light from other structures (e.g., background device structures) from reaching the detector 3320.

The determination of the pattern of the opaque coating involves analyses of the contribution of the various components of the semiconductor substrate 1000 to the first diffraction pattern DP1 and the second diffraction pattern DP2. One method for determining the pattern of the opaque coating on a diffraction filter may involve obtaining diffraction patterns at the location of the diffraction pattern filter within the optical measurement apparatus 3000 using a first reference structure that replicates the semiconductor device 1000 of FIG. 1A without modification (i.e., including the underlying background structures), and a second reference structure that replicates the semiconductor device 1000 of FIG. 1A but without the background device structures (e.g., CUA structures). By determining the difference between the diffraction patterns generated by the first and second reference structures, the diffraction pattern from other structures can be determined and used to generate the pattern of opaque coating applied to the filter substrate 3240 to manufacture the diffraction pattern filter 3200.

Once the diffraction pattern filter 3200 of FIG. 1A is manufactured, the diffraction pattern filter 3200 can be mounted in the detection assembly 3300 of the nanoscale-dimension measurement apparatus 1000 to measure nanoscale dimensions of the target device array structure while minimizing interference from underlying background device structures (e.g., CUA structures).

Figure 2A:
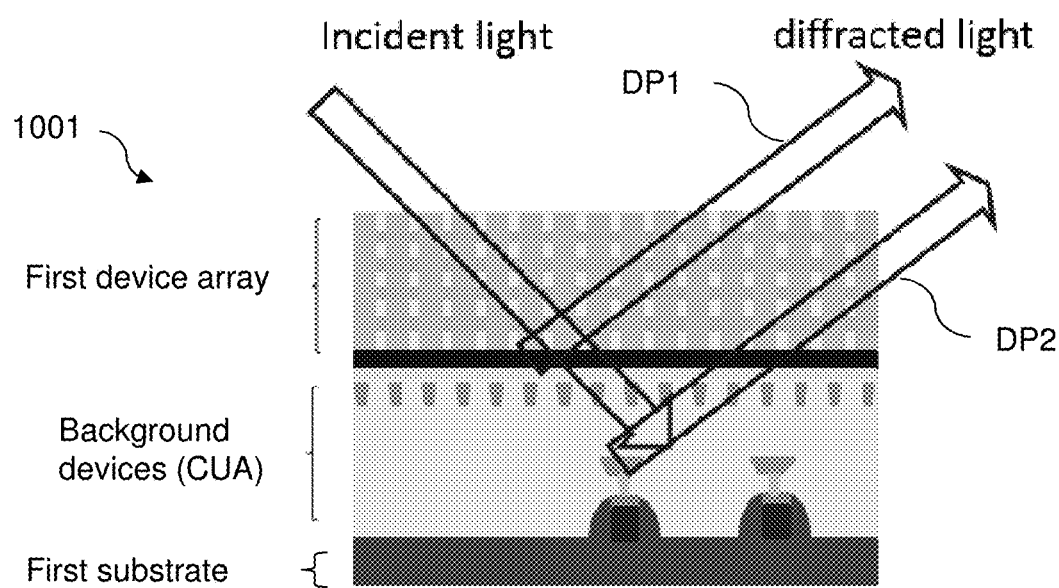
FIG. 2A is a schematic vertical cross-sectional view of a first reference structure that includes background device structures between the three-dimensional array and an underlying substrate.

Referring to FIG. 2A, a first reference structure 1001 is illustrated, which includes a first device array structure, a first substrate, and instances of background device structures located between the first device array structure and the first substrate. The first substrate can have the same composition and the same thickness as the substrate of the semiconductor device 1000 of FIG. 1A. The first device array structure can include a three-dimensional device array structure in which instances of a unit geometrical feature are repeated in three different directions that are not within a two-dimensional plane. For example, the instances of the unit geometrical feature may be repeated along an x-direction, a y-direction, and a z-direction in a Cartesian coordinate system. For example, the unit geometrical feature may be a cylindrical cavity laterally surrounded by a vertical stack of an insulating layer and a spacer material layer. In a two-dimensional array of memory openings that extend through a vertically alternating stack of multiple insulating layers and multiple spacer material layers, the unit geometrical feature is repeated in three different directions that are not within a two-dimensional plane to provide a three-dimensional periodic structure.

The first reference structure 1001 and the target device array structure of the semiconductor device 1000 can include the same type of unit geometrical features. The three-dimensional periodicity of the unit geometrical features may be the same across the semiconductor device 1000 and the first reference structure 1001. In one embodiment, the first reference structure 1001 may be substantially the same as the semiconductor device 1000 for all geometrical and compositional features. In one embodiment, multiple instances of a semiconductor device may be manufactured, and an instance of the semiconductor device may be used as the first reference structure 1001 and in the process of generating a diffraction pattern filter that is used in measurements of other incidences of the semiconductor device 1000 of FIG. 1A. In another embodiment, the same semiconductor structure may be used as the first reference structure 1001, and may be subsequently used as the semiconductor structure of FIG. 1A, i.e., as a target structure of which geometrical features are to be characterized using the exemplary nanoscale-dimension measurement apparatus of various embodiments. In other words, the first reference structure 1001 may be manufactured in the same manner as the target semiconductor device 1000 that is to be measured.

A first reference diffraction pattern can be generated from the first reference structure by mounting the first reference structure on the nanoscale-dimension measurement apparatus 3000, illuminating the first reference structure with light from the light source 3100, and collecting spatial and spectral information on the diffracted light at the location where the diffraction filter 3200 will be positioned within the detection assembly 3300.

Figure 2B:
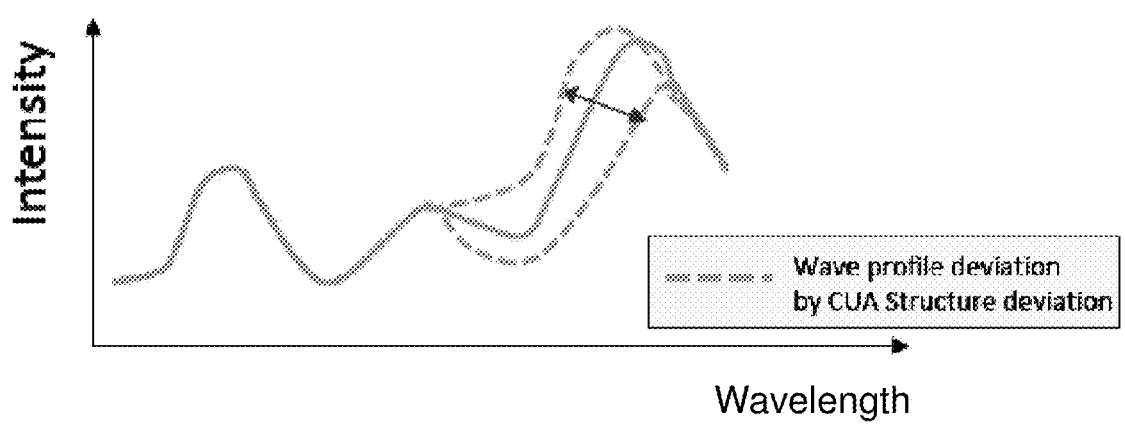
FIG. 2B is an intensity distribution of diffracted light as a function of wavelength for the first reference structure of FIG. 2A.

Referring to FIG. 2B, an intensity distribution of diffracted light from the first reference structure is illustrated as a function of wavelength for a selected spatial direction. Each spatial direction has a respective intensity distribution of diffracted light from the first reference structure. The solid curve represents a hypothetical spectral distribution of reflected light (i.e., no diffraction). The dashed lines represent the spectral distribution of light diffracted by the first reference structure. Two dashed lines are shown to illustrate that the intensity of the measured spectral distribution of diffracted light may increase or decrease in any given wavelength range with respect to the reflected light due to diffraction from the target array structures to be measured plus diffraction from other structures (e.g., background device structures) in the first reference structure. The diffracted light target array structure to be measured cannot be distinguished from light diffracted by other structures. Thus, the diffraction pattern from other device structures introduce noise into the spatial measurements of target array structures.

According to an aspect of the present disclosure, a second reference structure that does not include the background device structures is used in order to quantitatively determine the spectral intensity modification as a function of wavelength and as a function of a spatial angle.

Figure 3A:
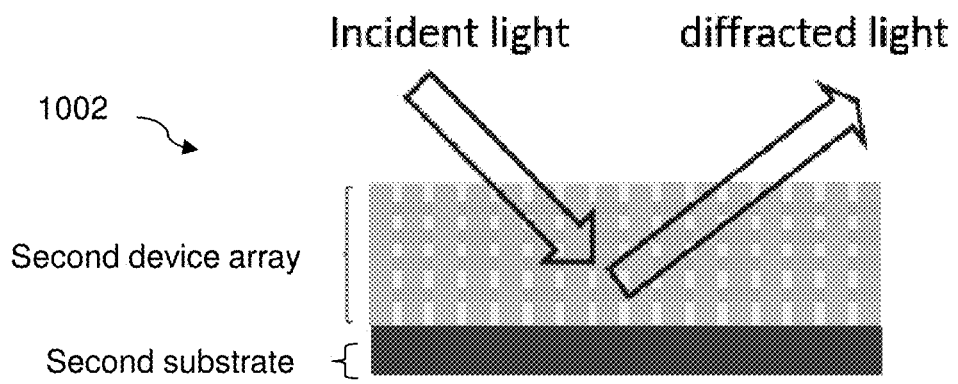
FIG. 3A is a schematic vertical cross-sectional view of a second reference structure that does not include background device structures between the three-dimensional array and an underlying substrate.

Referring to FIG. 3A, a second reference structure 1002 is illustrated, which includes the three-dimensional device array structure in which instances of the unit geometrical feature of the first device array structure and the target device array structure are located over a second substrate but without any underlying background device structures (e.g., CUA structures). The second reference structure 1002 may be manufactured using the processes used in forming the three-dimensional device array structure and geometric features of the first reference structure except that though structures can be located directly on the substrate without any intervening structure therebetween. The second substrate can have the same composition and the same thickness as the substrate of the semiconductor device 1000 of FIG. 1A. The second device array structure can include a three-dimensional device array structure in which instances of the unit geometrical feature of the first device array structure and the target device array structure are repeated in three different directions that are not within a two-dimensional plane. Thus, the second device array structure can be identical in structure and composition to the first device array structure of the first reference structure 1001 and the target device array structure of the semiconductor device 1000, but without the background device structures.

A second reference diffraction pattern can be generated from the second reference structure by mounting the second reference structure on the exemplary nanoscale-dimension measurement apparatus, illuminating the second reference structure with light from the light source 3100, and collecting spatial and spectral information on diffracted light at the location within the detection assembly 3300 at which the diffraction pattern filter 3200 will be placed.

Figure 3B:
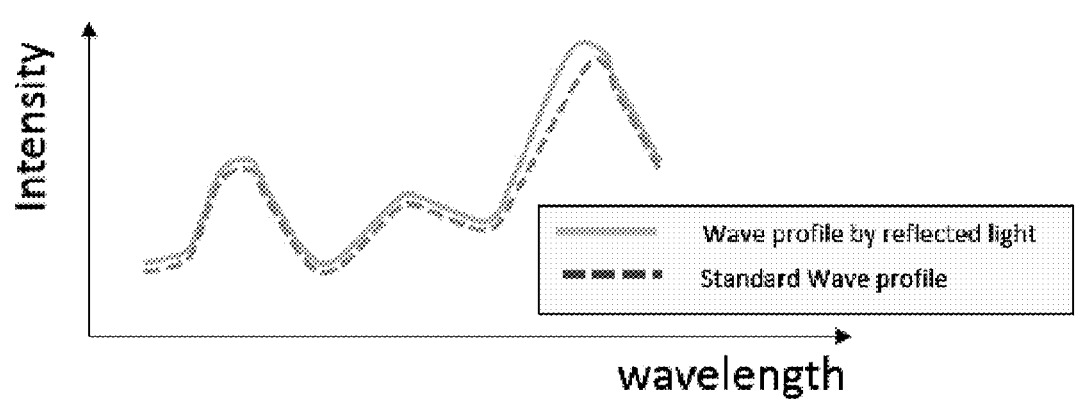
FIG. 3B is an intensity distribution of diffracted light as a function of wavelength for the second reference structure of FIG. 3A.

Referring to FIG. 3B, an intensity distribution of diffracted light from the second reference structure is illustrated as a function of wavelength for a selected spatial direction. Each spatial direction has a respective intensity distribution of diffracted light from the first reference structure. The solid curve represents the spectral distribution of reflected light. The dashed curve represents the spectral distribution of light diffracted by the target device structure to be measured on target semiconductor devices 1000. The deviation of the solid curve from the dashed curve represents the modification to the diffracted light due to the presence of the second device array structure in the second reference structure.

Generally, each of the first device array structure in the first reference structure 1001, the second device array structure in the second reference structure 1002, and the target device array structure in the semiconductor device 1000 includes a respective three-dimensional device array structure in which instances of a unit geometrical feature are repeated in three different directions that are not within a two-dimensional plane. Each of the first device array structure in the first reference structure 1001, the second device array structure in the second reference structure 1002, and the target device array structure in the semiconductor device 1000 can have the same structural and compositional features. Each of the first device array structure in the first reference structure 1001, the second device array structure in the second reference structure 1002, and the target device array structure in the semiconductor device 1000 can be components of a semiconductor chip having a same size. Corresponding pitches of the first device array structure, the second device array structure, and the target device array structure do not differ one from another by more than 1.0% along each direction of periodicity.

Each of the first device array structure, the second device array structure, and the target device array structure includes a respective three-dimensional memory array including a respective three-dimensional repetition of a unit memory cell. Each three-dimensional memory array of the first device array structure, the second device array structure, and the target device array structure may include a respective two-dimensional array of memory openings extending through an alternating stack of insulating layers and spacer material layers.

Figure 4A:
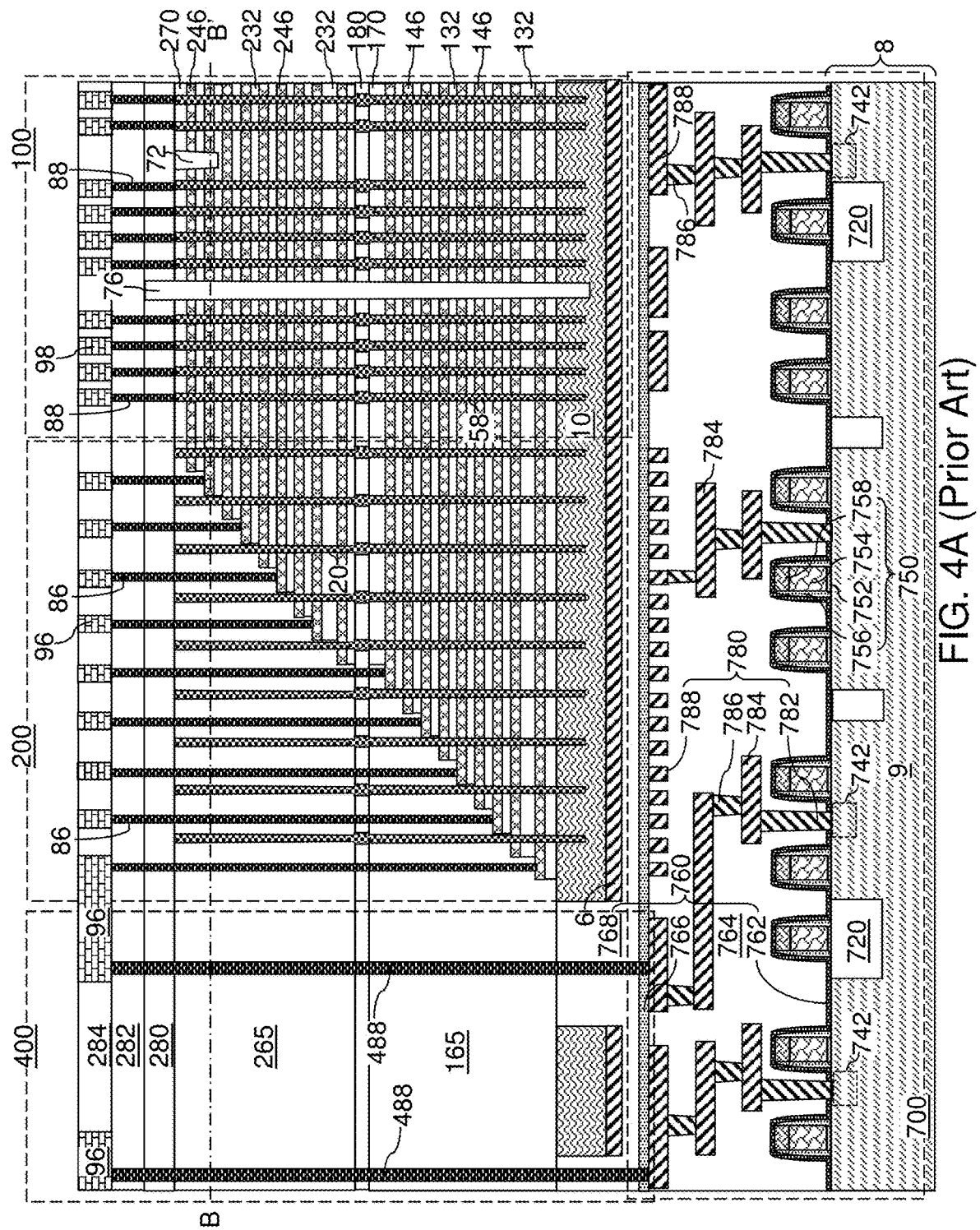
FIG. 4A is a vertical cross-sectional view of a prior art three-dimensional memory device, of which feature sizes can be measured during a manufacturing process using a nanoscale-dimension measurement apparatus of various embodiments.
Figure 4B:
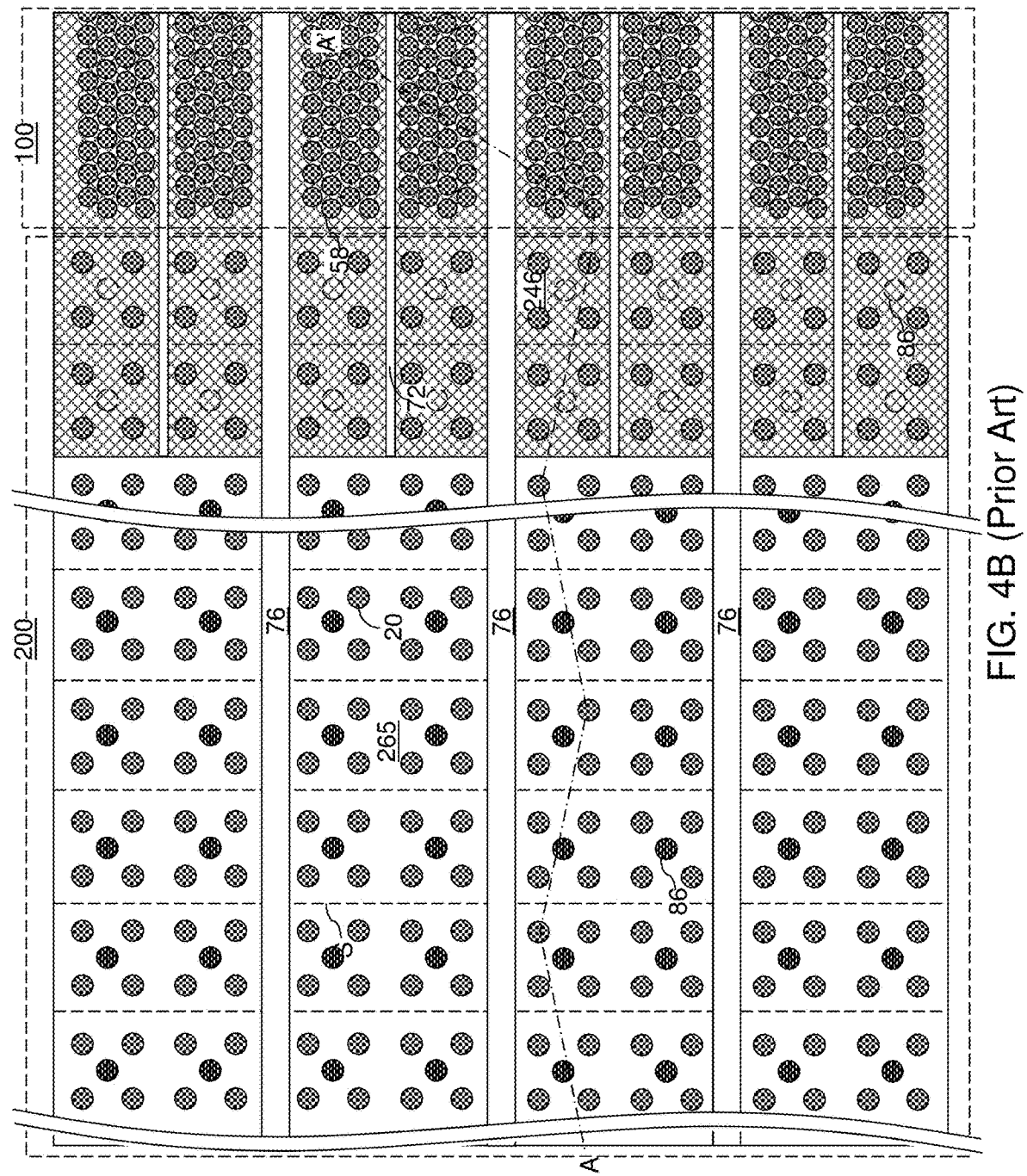
FIG. 4B is a horizontal cross-sectional view along the horizontal plane B-B' of the prior art three-dimensional memory device of FIG. 4A.

FIGS. 4A and 4B illustrate a representative three-dimensional memory device of which feature sizes can be measured at various stages of fabrication (i.e., in-process) using a nanoscale-dimension measurement apparatus 3000 of various embodiments. The three-dimensional memory device includes a substrate 8 that includes a semiconductor material. CMOS devices and metal interconnect structures can be formed as background device structures 700 on the substrate 8. Shallow trench isolation structures 720 can be provided on the front side of the substrate 8. The background device structures 700 can include field effect transistors, each of which includes a pair of active regions (i.e., a source region and a drain region) and a gate structure 750. The gate structure 750 includes a gate dielectric 752, a gate electrode 754, a gate spacer 756, and a gate cap dielectric 758. The background device structures 700 can also include various metal interconnect structures 780 embedded in various dielectric material layers 760. The metal interconnect structures 780 can include contact via structures 782, lower level metal lines 784, upper level via structures 786, and upper level metal lines 788. The various dielectric material layers 760 can include, for example, a dielectric liner 762, first dielectric material layers 764, a diffusion barrier layer 766, and second dielectric material layers 768.

A device array structure can be formed over the background device structures 700. The device array structure can be formed within an array region 100, which can be adjacent to a terrace region 200 and a peripheral device connection region 400. For example, a metal plate layer 6 and a source-level semiconductor layer 10 can be formed in, or on, the second dielectric material layers 768. A first alternating stack of first insulating layers 132 and first spacer material layers can be formed over the source-level semiconductor layer 10. The first spacer material layers can be formed as first electrically conductive layers 146, or can be formed as first sacrificial material layers and can be subsequently replaced with first electrically conductive layers 146. A first insulating cap layer 170 can be formed over the first alternating stack. First stepped surfaces including vertical steps S can be formed by patterning the first alternating stack. The methods of various embodiments may be used to measure the lateral dimensions of the first stepped surfaces in-process.

A first retro-stepped dielectric material portion 165 can be formed over the first stepped surfaces. An inter-tier dielectric layer 180 can be formed over the first insulating cap layer 170 and the first retro-stepped dielectric material portion 165. First memory openings and first support opening can be formed through the first alternating stack. The first memory openings and the first support openings can vertically extend to the source-level semiconductor layer 10. The first memory openings can be formed as a two-dimensional periodic array. The first memory openings and the first support openings can be formed with sacrificial material portions. The methods of various embodiments may be used to measure the average lateral dimensions (such as an average diameter) of the first memory openings.

A second alternating stack of second insulating layers 232 and second spacer material layers can be formed over the inter-tier dielectric layer 180. The second spacer material layers can be formed as second electrically conductive layers 246, or can be formed as first sacrificial material layers and can be subsequently replaced with second electrically conductive layers 246. A second insulating cap layer 270 can be formed over the second alternating stack. Drain-select-level isolation structures 72 can be formed in an upper portion of the second alternating stack. Second stepped surfaces including vertical steps S can be formed by patterning the second alternating stack. The methods of various embodiments may be used to measure the lateral dimensions of the second stepped surfaces.

A second retro-stepped dielectric material portion 265 can be formed over the second stepped surfaces. Second memory openings and second support opening can be formed through the second alternating stack over the sacrificial material portions filling the first memory openings and the first support openings. The sacrificial material portions can be removed from underneath the second memory openings and the second support openings to provide inter-tier memory openings and inter-tier support openings, which extend through the first alternating stack and the second alternating stack. Memory opening fill structures 58 including a respective blocking dielectric, a respective charge storage layer, a respective tunneling dielectric, and a respective vertical semiconductor channel can be formed in each of the inter-tier memory openings. Support pillar structures 20 including a same set of components can be formed in the inter-tier support openings.

A first contact level dielectric layer 180 can be formed over the second alternating stack. Backside trenches can be formed as needed through the second alternating stack and the second alternating stack. The backside trenches may be used to replace materials of the source-level semiconductor layer 10 and/or to replace sacrificial material layers within the first and second alternating stacks with first and/or second electrically conductive layers (146, 246). The methods of various embodiments may be used to measure lateral dimensions of the backside trenches in-process.

The backside trenches can be subsequently filled with dielectric wall structures 76. A second contact level dielectric layer 282 can be formed over the first contact level dielectric layer 280. Contact via structures (88, 86, 488) can be subsequently formed, which can include drain contact via structures 88, stepped-surface contact via structures 86, and through-memory-level via structures 488. A line level dielectric layer 284 can be formed above the second contact level dielectric layer 282, and various metal lines (96, 98) can be formed within the line level dielectric layer 284. The metal lines (96, 98) can include interconnect metal lines 96 and bit lines 98 for accessing the vertical semiconductor channels within the memory opening fill structures 58.

The substrate of the semiconductor device 1000 can underlie instances of the background device structures 700, and can have the same material composition as the first substrate of the first reference structure 1001, and thus may provide the same or similar optical responses from the underlying background device structures. The background device structures 700 may include field effect transistors, and the CMOS devices in the background device structures 700 can be formed as a two-dimensional periodic array. The instances of the background device structures 700 on the first substrate of the first reference structure 1001 and additional instances of the background device structures 700 in the structure under measurement (i.e., the semiconductor device 1000) can have a same or similar two-dimensional periodicity.

The representative three-dimensional memory device illustrated in FIGS. 4A and 4B is an example of a semiconductor device 1000 for which the optical measurement apparatus 3000 in FIG. 1A can be used. The background device structures 700 include CMOS-under-array devices, and contain CMOS devices and metal interconnect structures. The presence of the background device structures 700 introduces a background diffraction pattern that adds noise to measurements of dimensions within the memory array region 100 or the terrace region 200. The methods of various embodiments subtract the background diffraction pattern generated by the background device structures 700 via the diffraction pattern filter 3200, thereby providing accurate measurement of nanoscale dimensions of the various device features during manufacture of the various components in the memory array region 100 and the terrace region 200.

Measurement of the spectral distribution of diffracted light for all measurable spatial directions from the first reference structure 1001 generates a map of intensity modification in the diffracted light from the first reference structure 1001 as a function of the spatial angle and as a function of wavelength. Measurement of the spectral distribution of diffracted light for all measurable spatial directions from the second reference structure 1002 at the location of the diffraction pattern filter 3200 within the detection assembly 3300 generates a map of intensity modification in the diffracted light from the second reference structure 1002 as a function of the spatial angle and as a function of wavelength. One method of measuring the spatial and spectral diffraction patterns involves placing an opaque material (e.g., white paper) at the location within the detection assembly where the diffraction pattern filter will be positioned and image (e.g., with a digital detection assembly) the light patterns that appear on the opaque material while the reference structures are illuminated.

Having measured the spatial and spectral diffraction patterns in this manner, the difference between the spectral distribution of diffracted light from the first reference structure 1001 and the spectral distribution of diffracted light from the second reference structure 1002 can be calculated for each spatial direction along which the optical detector can be aligned with respective to the stage, i.e., the location at which the first reference structure 1001 or the second reference structure 1002 is mounted. The difference between the spectral distribution of diffracted light from the first reference structure 1001 and the spectral distribution of diffracted light from the second reference structure 1002 can be converted into a spatial map for each wavelength to provide a difference diffraction pattern. The difference diffraction pattern is the difference between the first reference diffraction pattern and the second reference diffraction pattern as a function of wavelength. The difference diffraction pattern may include a set of spatial maps corresponding to different wavelengths. Thus, for any given wavelength, ranges of spatial angles that generate excess intensity in the diffracted light can be determined.

FIG. 5A stylistically illustrates a first exemplary diffraction filter 3200. The diffraction pattern filter 3200 can include a transparent substrate 3240 and an opaque pattern of opaque coating region 3230 located on the transparent substrate 3240. According to an aspect of the present disclosure, the opaque pattern 3230 is placed on the substrate 3240 over areas where the diffraction pattern formed by other structures (i.e., the second diffraction pattern DP2) peaks at the location of the filter within the optical measurement apparatus 3000. The opaque pattern 3230 can be formed from an opaque coating that will block the second diffraction pattern DP2 when the diffraction pattern filter 3200 is positioned in the detection assembly 3300. The rest of the diffraction pattern filter 3200 is transmitted through to the detector 3320. In other words, the diffraction pattern from the device array structure to be measure (i.e., the first diffraction pattern DP1) will pass through the transparent substrate 3240 to be imaged by the detector 3300. In case a peak of the first diffraction pattern DP1 and a peak of the second diffraction pattern DP2 overlap, the overlap area may be left free of opaque coating or a partial coating that attenuates the intensity of transmitted light may be applied.

The first exemplary diffraction filter 3200 can be formed by converting the ranges of spatial angles that generate excess intensity above a pre-determined threshold level from the second diffraction pattern DP2 into a pattern of areas to be blocked on a diffraction pattern filter 3200, i.e., into the pattern of the opaque coating regions 3230. In other words, a customized diffraction filter 3200 for the types of semiconductor structures 1000 that have the same structural characteristics as the first reference structure 1001 can be generated by analyzing the spatial pattern of the excess intensity above the pre-determined threshold level formed at the position in the detection assembly 3300 by other structures. The spatial pattern of the excess intensity can be converted into a pattern of areas at the position in the detection assembly 3300 at which the diffraction pattern filter 3200 is to be placed, and a customized diffraction filter 3200 can be manufactured by forming opaque patterns in areas corresponding to the spatial pattern of the excess intensity from the diffraction difference pattern. For example, an opaque coating can be applied in, on or over the transparent substrate 3240 and can be patterned to cover only the areas in which the difference between the spectral distribution of diffracted light from the first reference structure 1001 and the spectral distribution of diffracted light from the second reference structure 1002 generates an excess intensity above the predetermined threshold. In one embodiment, the opaque coating may be a metal coating deposited on the transparent substrate 3240.

The predetermined threshold level for assigning an opaque area on the diffraction filter 3200 can be determined based on the overall intensity of the diffracted light from the second reference structure 1002 along the spatial direction corresponding to the opaque area. Where the excess intensity in the spatial distribution of diffracted light from the first reference structure 1001 is greater than the intensity of the diffracted light from the second reference structure 1002 (which may be characterized by the total intensity or by an integrated intensity over a predefined wavelength range), the corresponding area of the diffraction filter 3200 can be made opaque. Elsewhere the diffraction filter 3200 can remain transparent.

Referring to FIG. 5B, a second embodiment diffraction filter 3200 includes graded opaque coating regions 3230 at locations where diffraction patterns from other structures (e.g., background device structures) are to be blocked or filtered out. In this embodiment, the graded opaque coating regions 3230 can include coatings of different types (such as coatings of different thicknesses and/or different materials) to provide graded blocking of light. The second embodiment diffraction filter 3200 can be formed by converting the ranges of spatial angles that generate excess intensity into gradations of opaqueness depending on the magnitude of the excess intensity between the diffraction pattern from the first reference structure and the diffraction pattern from the second reference structure. Areas corresponding to the spatial angles of greater excess diffraction pattern difference intensity are blocked with a more opaque coating to provide lesser transparency, while areas corresponding to the spatial angles of lesser excess diffraction pattern difference intensity are blocked with a lesser opaque coating to provide some transparency that is less than 100%. Thus, the diffraction filter 3200 can have a graded blocking pattern that provides lower transparency at locations on the diffraction pattern filter 3200 at which the other structures (e.g., background device structures) provide greater diffraction noise, and higher transparency (that is less than 100%) at locations on the diffraction pattern filter 3200 at which the other structures provide lesser diffraction noise.

Either of the first and/or second embodiment diffraction filters 3200 can include a plurality of opaque coatings that provide opacity only within limited wavelength ranges. For example, the opaque coatings can include a material that absorbs light only within a narrow wavelength range. In some embodiments, multiple opaque coatings can be used to absorb light at respective wavelength ranges. The thickness of the various opaque coatings can be selected such that the set of all opaque coatings provide blocking of spectral light across the entire wavelength range that the optical detector 330 can detect.

In some cases, the spatial locations diffraction pattern filter 3200 of excess intensity due to the other structures (e.g., background device structures) may differ with wavelength of the incident light. Therefore, some embodiments may use multiple opaque coatings to provide wavelength-specific opacity at different locations on the diffraction filter 3200 consistent with the spatial locations on the diffraction pattern filter 3200 of excess intensity of the second diffraction pattern from background device structures at various wavelengths.

Generally, a diffraction filter 3200 of various embodiments can comprise a diffraction blocking pattern of a light-absorbing material located on or in an optically transparent matrix that forms the transparent substrate 3240. The pattern of light-absorbing areas on the diffraction filter 3200 of various embodiments can be selected from a grayscale light-absorbing pattern as illustrated in FIG. 5B or a black-and-white light-absorbing pattern as illustrated in FIG. 5A.

In one embodiment, the two-dimensional periodic array of discrete light-absorbing material portions comprises a two-dimensional periodic array of a unit grayscale light-absorbing material pattern. In one embodiment, the unit grayscale light-absorbing material pattern comprises a concentric pattern in which light absorption decreases radially with a distance from a geometrical center of the concentric pattern. Alternatively, the two-dimensional periodic array of discrete light-absorbing material portions comprises a two-dimensional periodic array of a black-and-white light-absorbing material pattern.

The diffraction filter 3200 of various embodiments can be manufactured by determining where the difference diffraction pattern exceeds a predetermined threshold. In various embodiments, the predetermined threshold can be greater than 1%, and may be greater than 2%, and/or may be greater than 5%, of a maximum intensity of the difference diffraction pattern. Then, a pattern of the map of diffraction peaks from other structures can be replicated in a light-absorbing material on or in the optically transparent matrix (e.g., transparent substrate 3240) to form the diffraction blocking pattern on or in the optically transparent matrix 3240.

In one embodiment, the first reference diffraction pattern, the second reference diffraction pattern, and the diffraction pattern generated from the structure being measured can be multispectral diffraction patterns measured at two or more optical wavelengths (such as an entire visible wavelength range from 400 nm to 800 nm), and the diffraction filter 3200 may block at least 80% of an intensity of the difference pattern at each wavelength for the multispectral diffraction patterns.

After manufacture, the diffraction filter 3200 can be inserted into the detection assembly 3300 of a nanoscale-dimension measurement apparatus 3000 as illustrated in FIG. 1A. With a diffraction filter 3200 that is customized to remove diffraction patterns generated from the other structures (e.g., background device structures positioned before the detection assembly 3300), the exemplary nanoscale-dimension measurement apparatus 3000 filters out a predominant portion of the second diffraction pattern DP2 produced by the other structures (e.g., CUA structures) that are present within the semiconductor device, enabling the detector 3320 to measure the diffraction pattern of the target structures.

Figure 6:
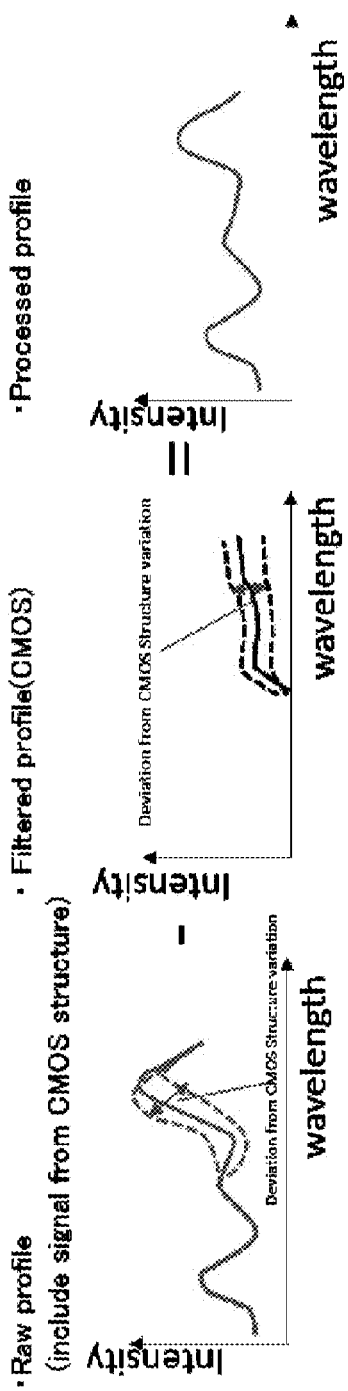
FIG. 6 is a schematic illustration of the spectrum filtering process used in the exemplary nanoscale-dimension measurement apparatus according to an embodiment of the present disclosure.

FIG. 6 schematically illustrates the noise-filtering mechanism of the diffraction filter 3200 of various embodiments. For a given spatial orientation, the diffracted light from the semiconductor device 1000 includes a corresponding spatial component of the first diffraction pattern DP1 and the second diffraction pattern DP2, which is illustrated as a "Raw profile" in FIG. 6. The diffraction filter 3200 filters out the component of the second diffraction pattern DP2 from the "Raw profile." The component of the second diffraction pattern DP2 is illustrated as the "Filtered profile," which includes the diffraction components generated by other structures (e.g., background device structures like CMOS devices) located on the substrate of the semiconductor device 1000. Upon filtering out of the second diffraction pattern DP2 by the diffraction filter 3200, the light that passes through the diffraction filter 3200 has the "processed profile," which is representative of the target device structures to be measured. Thus, the stationary diffraction filter 3200 filters out the second diffraction pattern DP2 from the combined diffraction pattern to provide only the first diffraction pattern DP1 generated from the target device array structure within the semiconductor substrate 1000.

Figure 7:
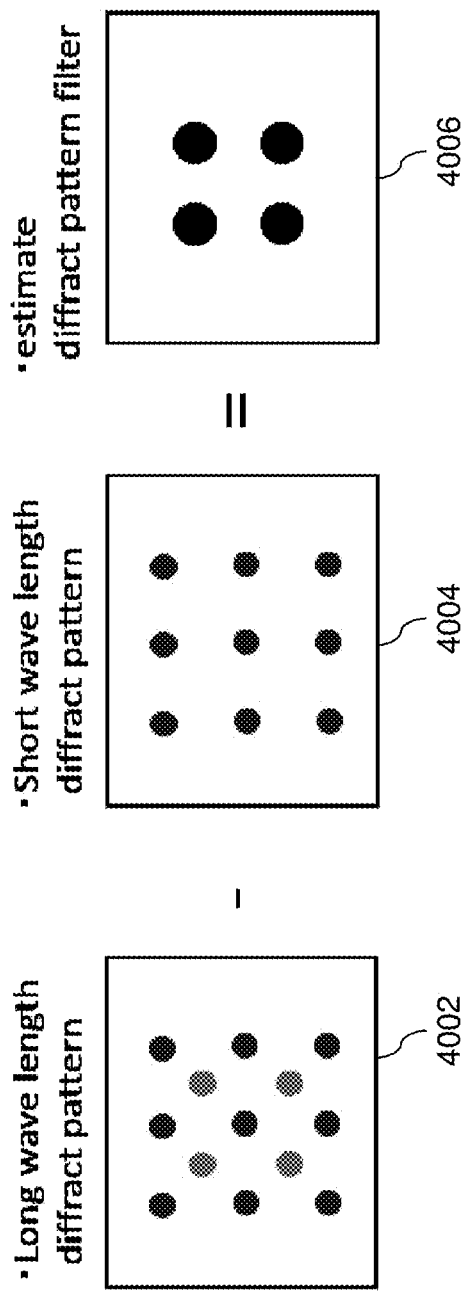
FIG. 7 is a schematic illustration of an opaque pattern of a diffraction filter for a nanoscale-dimension measurement apparatus of various embodiments.

In some embodiments, the target device array structure and the CMOS devices can have different periodicities. Referring to FIG. 7, another method of designing a diffraction filter 3200 for a nanoscale-dimension measurement apparatus of various embodiments is illustrated. This method will work when the target array device has a short pitch compared to the pitch of the underlying other structures (e.g., background device structures like CMOS device structures). Thus, the first diffraction pattern DP1 can have a long spatial periodicity (i.e., a wide angular periodicity) that will be formed by light of a shorter wavelength than the light that will generate a diffraction pattern off of the CMOS device structures that have a long pitch. With such structures in the target semiconductor device 1000, the pattern of the diffraction filter 3200 can be generated by subtracting the diffraction pattern 4004 obtained using short wavelength light illumination (which forms a diffraction pattern off of structures with the small special periodicity) from the diffraction pattern 4002 obtained using long wavelength light illumination (which forms a diffraction pattern off of structures having both long and small special periodicity), and by replicating the net pattern 4006 (i.e., diffraction pattern difference of excess intensity) into opaque coating regions 3230 on a transparent substrate 3240. The resulting pattern of the opaque coating regions 3230 will correspond to the second diffraction pattern DP2 (i.e., to structures that generate a diffraction pattern only for long wavelength light) so that the diffusion filter 3200 can block the second diffraction pattern DP2.

In various embodiments of the disclosure, a method of making a diffraction pattern filter for use in an optical nanoscale-dimension measurement apparatus may include determining, at a position within a detection assembly of the optical nanoscale-dimension measurement apparatus of the diffraction pattern filter, a first diffraction pattern of light diffracted from a semiconductor device that includes a diffraction pattern of light diffracted from periodic structure to be measured and a diffraction pattern of light diffracted from other structures, determining, at the position within the detection assembly of the optical nanoscale-dimension measurement apparatus of the diffraction pattern filter, a second diffraction pattern of light diffracted from a semiconductor device that includes the diffraction pattern of light diffracted from the periodic structure to be measured but not from other structures, generating a difference diffraction pattern by subtracting the second diffraction pattern from the first diffraction pattern, and forming the diffraction pattern filter by placing opaque material on or within a transparent medium at locations corresponding to the generated difference diffraction pattern.

Figure 8:
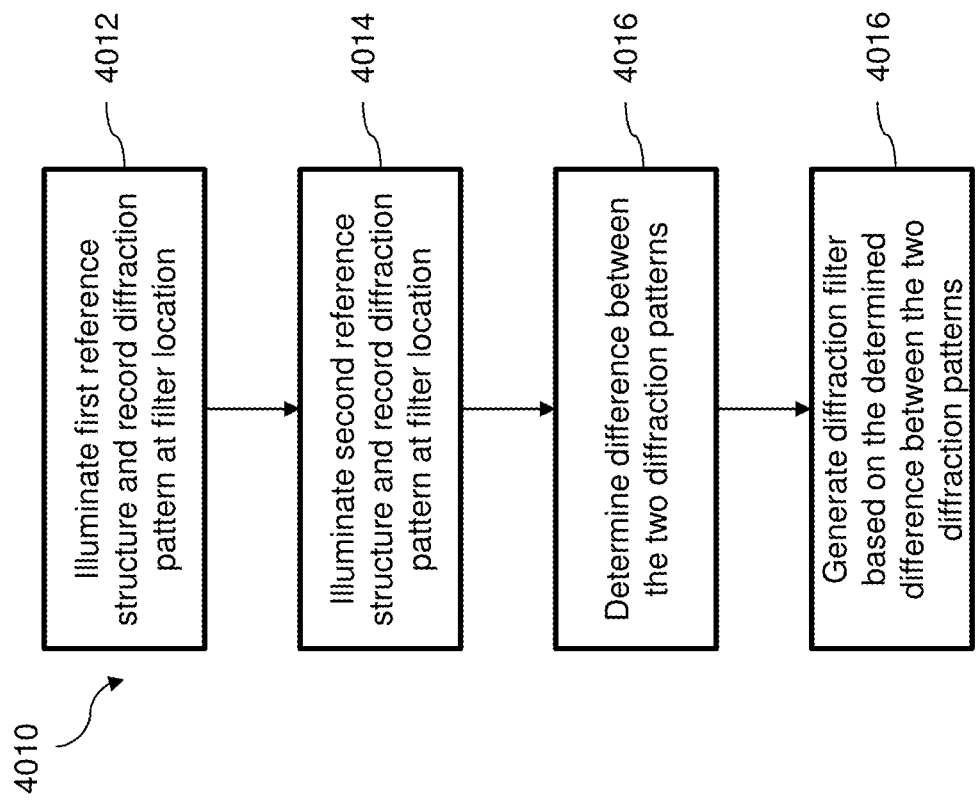
FIG. 8 is process flow diagram of a first method for generating a diffraction filter for a nanoscale-dimension measurement apparatus according to an embodiment of the present disclosure.

FIG. 8 illustrates a method 4010 of generating a diffraction filter for an optical nanoscale-dimension measurement tool according to an embodiment of the present disclosure. Various operations of the method 4010 may be performed by a computing device of the optical nanoscale-dimension measurement tool or a computing device configured to receive diffraction pattern data from the optical nanoscale-dimension measurement tool and generate a diffraction filter based on the received data.

In step 4012, the optical nanoscale-dimension measurement tool may illuminate a first reference structure that includes a first representative device array structure representative of the structure to be measured located over other structures (e.g., background device structures), and measure the first diffraction pattern from the first reference structure. In other words, in step 4012 measurements are taken at the location for the diffraction filter of the combined diffraction patterns from structures that include the periodic structure to be measured located over the other structures. The first reference structure may be a representative in-process three-dimensional memory device formed over CMOS devices and metal interconnect structures on a substrate.

In step 4014, the optical nanoscale-dimension measurement tool may illuminate a second reference structure that includes a representative device array structure representative of the structure to be measured located over a substrate but without background device structures, and measure the resulting diffraction pattern at the location for the diffraction filter. The second reference structure may be a representative of the structures in an in-process three-dimensional memory device but formed on a substrate without the underlying CMOS devices and metal interconnect structures.

One method of measuring the spatial and spectral diffraction patterns in steps 4012 and 4014 involves placing an opaque material (e.g., white paper) at the location within the detection assembly where the diffraction pattern filter will be positioned and image (e.g., with a digital detection assembly) the light patterns that appear on the opaque material while the reference structures are illuminated.

In step 4016, the computing device may determine the difference between the two recorded diffraction patterns. The computing device may generate a difference diffraction pattern by subtracting the second diffraction pattern from the first diffraction pattern by subtracting one image from another to result in a diffraction difference image. Alternatively, the computing device may accomplish this by performing digital analysis processing of the two diffraction patterns to identify diffraction patterns that appear in the long wavelength diffraction pattern but not in the short wavelength diffraction pattern. Other methods for determining the diffraction difference pattern may be used.

In step 4018, the computing device may generate a diffraction filter based on the determined difference between the two diffraction patterns. As described above, this may involve forming the diffraction pattern filter by placing opaque material on or within a transparent medium at locations corresponding to the generated difference diffraction pattern. The generated diffraction pattern may then be used in an optical nanoscale-dimension measurement tool for measuring dimensions of a device to be measure.

FIG. 9 illustrates a method 4020 of generated a diffraction filter for an optical nanoscale-dimension measurement tool according to an embodiment of the present disclosure. Various operations of the method 4020 may be performed by a computing device of the optical nanoscale-dimension measurement tool or a computing device configured to receive diffraction pattern data from the optical nanoscale-dimension measurement tool and generate a diffraction filter based on the received data.

In step 4022, the optical nanoscale-dimension measurement tool may illuminate a long wavelength light on the device to be measured (or a representative device) and record the diffraction pattern generated as a result at the location for the diffraction filter. The long wavelength of the light may be selected as a wavelength that results in a diffraction pattern generated both by the device array structure to be measured and any other structures (e.g., background device structures).

In step 4024, the optical nanoscale-dimension measurement tool may illuminate a short wavelength light on the device to be measured (or a representative device) and record the diffraction pattern generated as a result at the location for the diffraction filter. The short wavelength of the light may be selected as a wavelength that results in a diffraction pattern generated by the device array structure to be measured but not by any other structures (e.g., background device structures).

One method of measuring the spatial and spectral diffraction patterns in steps 4022 and 4024 involves placing an opaque material (e.g., white paper) at the location within the detection assembly where the diffraction pattern filter will be positioned and image (e.g., with a digital detection assembly) the light patterns that appear on the opaque material while the reference structures are illuminated.

In step 4026, the computing device may determine the difference between the two diffraction patterns. The computing device may generate a difference diffraction pattern by subtracting the second diffraction pattern from the first diffraction pattern by subtracting one image from another to result in a diffraction difference image. Alternatively, the computing device may accomplish this by performing digital analysis processing of the two diffraction patterns to identify diffraction patterns that appear in the long wavelength diffraction pattern but not in the short wavelength diffraction pattern. Other methods for determining the diffraction difference pattern may be used.

In step 4028, the computing device may generate a diffraction filter based on the determined difference between the two diffraction patterns. As described above, this may involve forming the diffraction pattern filter by placing opaque material on or within a transparent medium at locations corresponding to the generated difference diffraction pattern, i.e., at the locations of diffraction patterns that appear in the long wavelength diffraction pattern but not in the short wavelength diffraction pattern. The generated diffraction pattern may then be used in an optical nanoscale-dimension measurement tool for measuring dimensions of a device to be measure.

Referring to all drawing and according to various embodiments of the present disclosure, a measurement apparatus for measuring dimensions within a semiconductor device is provided, which is an optical nanoscale-dimension measurement tool. The measurement apparatus comprises: an illumination source 3100 and an optics system configured to direct light onto a stage configured to hold a semiconductor device 1000 under measurement; a detection assembly 3300 detection assembly configured to receive light diffracted by the semiconductor device, in which the detection assembly includes a detector 3320 configured to receive light diffracted by the semiconductor device and determine a measurement of a periodic structure within the semiconductor device based on the received diffracted light, and a diffraction pattern filter 3200 configured to permit light diffracted by the periodic structure to be measured to reach the detector and block at least a portion of light diffracted by other structures in the semiconductor device from reaching the detector. The semiconductor device may be an in-process three-dimensional memory device in which three-dimensional memory structures are formed over an underlying array of complementary metal-oxide-semiconductor (CMOS) devices formed on a semiconductor substrate, the periodic structure to be measured may comprise a two-dimensional array of vertical stacks of memory elements, and the other structures may comprise the underlying array of CMOS devices.

In an embodiment the diffraction filter comprises a diffraction blocking pattern of a light-absorbing material located on or in an optically transparent matrix, wherein the diffraction blocking pattern corresponds to a pattern of light diffracted by the other structures in the semiconductor device at a location within the detection assembly at which the diffraction pattern filter is positioned. In an embodiment, the two-dimensional periodic array of discrete light-absorbing material portions comprises a two-dimensional periodic array of a unit grayscale light-absorbing material pattern. The unit grayscale light-absorbing material pattern may comprise a concentric pattern in which light absorption decreases radially with a distance from a geometrical center of the concentric pattern. The two-dimensional periodic array of discrete light-absorbing material portions may comprise a two-dimensional periodic array of a light-absorbing material pattern.

In an embodiment, the detection assembly further comprises a lens, and the diffraction pattern filter is positioned between the lens and the detector.

According to an embodiment of the present disclosure, a method of measuring a dimension of a periodic structure of a semiconductor device using an optical nanoscale-dimension measurement apparatus includes placing a diffraction pattern filter within a detection assembly of the optical nanoscale dimension measurement apparatus, wherein the diffraction pattern filter is configured to permit light diffracted by the periodic structure to reach a detector within the detection assembly and block at least a portion of light diffracted by other structures in the semiconductor device from reaching the detector, illuminating the semiconductor device with light so that light diffracted from the semiconductor device is received by the detection assembly, and measuring at least one dimension of the periodic structure of the semiconductor device based on a diffraction pattern in the light diffracted from the semiconductor device.

Measuring the at least one dimension of the periodic structure of the semiconductor device may comprise measuring an average lateral dimension of unit geometrical features within the periodic structure of the semiconductor device. The semiconductor device may be an in-process three-dimensional memory device in which three-dimensional memory structures are formed over an underlying array of complementary metal-oxide-semiconductor (CMOS) devices formed on a semiconductor substrate, the periodic structure to be measured may comprise a two-dimensional array of vertical stacks of memory elements, and the other structures may comprise the underlying array of CMOS devices. The periodic structure of the semiconductor device may comprise a two-dimensional array of vertically-extending openings and measuring the average lateral dimension of unit geometrical features within the periodic structure of the semiconductor device may comprise measuring an average lateral dimension of the two-dimensional array of vertically-extending openings along a horizontal direction.

According to an embodiment of the present disclosure, methods of making a diffraction pattern filter include determining a first diffraction pattern of light diffracted from a semiconductor device that includes placing opaque material on a transparent medium at locations in a diffraction pattern from structures to be measured and a diffraction pattern of light diffracted from other structures, determining a second diffraction pattern that does not include the diffraction pattern from other structures, generating a difference diffraction pattern by subtracting the second diffraction pattern from the first diffraction pattern, and forming the diffraction pattern filter by to the generated difference diffraction pattern.

In one embodiment, determining the first diffraction pattern of light diffracted from the semiconductor device that includes the diffraction pattern of light diffracted from periodic structure to be measured and the diffraction pattern of light diffracted from other structures comprises measuring the first diffraction pattern from a first reference structure that includes the periodic structure to be measured located over the other structures, and determining the second diffraction pattern of light diffracted from the semiconductor device that includes the diffraction pattern of light diffracted from the periodic structure to be measured but not from other structures comprises measuring the second reference diffraction pattern from a second reference structure includes the periodic structure to be measured but not the other structures.

In one embodiment, determining the first diffraction pattern of light diffracted from the semiconductor device that includes the diffraction pattern of light diffracted from periodic structure to be measured and the diffraction pattern of light diffracted from other structures comprises illuminating the semiconductor device with light having a first wavelength that will be diffracted by the periodic structure to be measured and by the other structures, and determining the second diffraction pattern of light diffracted from the semiconductor device that includes the diffraction pattern of light diffracted from the periodic structure to be measured but not from other structures comprises illuminating the semiconductor device with light having a second wavelength that will be diffracted by the periodic structure to be measured but that will not be diffracted by the other structures.

In one embodiment, forming the diffraction pattern filter by placing opaque materials on or within a transparent medium at locations corresponding to the generated difference diffraction pattern comprises determining a map where the difference diffraction pattern exhibits an intensity that exceeds a threshold, the threshold being greater than 1% of a maximum intensity of the difference diffraction pattern, and replicating the map when placing opaque materials on or within a transparent medium at locations corresponding to the generated difference diffraction pattern.

In one embodiment, placing opaque material on or within the transparent medium at locations corresponding to the generated difference diffraction pattern comprises applying a grayscale light-absorbing material pattern on or within the transparent medium. The unit grayscale light-absorbing material pattern may comprise a concentric pattern in which light absorption decreases radially with a distance from a geometrical center of the concentric pattern.

In one embodiment, the first diffraction pattern and the second diffraction pattern are multispectral diffraction patterns measured at two or more optical wavelengths, and the diffraction filter blocks at least 80% of an intensity of the difference diffraction pattern at each wavelength for the multispectral diffraction patterns.

The measurement apparatus of various embodiments provides accurate measurements of dimensions of geometrical features that are present within a target device array structure when the target device array structure is located over an underlying array of other structures (e.g., background device structures 700) that generate interference peaks in the diffraction pattern. The diffraction pattern filter 3200 is designed to block out or attenuate the diffraction pattern of structures other than those being measured, including underlying array of background device structures 700, from the diffraction pattern that emerges from the semiconductor device under measurement. Accurate measurement of geometrical features in the target device array structure is possible by removal of the optical noise generated in the form of diffraction patterns from other structures, such as from the underlying array of background device structures 700.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A measurement apparatus, comprising:
   an illumination source configured to direct light onto a stage configured to hold a semiconductor device; and
   a detection assembly configured to receive light diffracted by the semiconductor device, the detection assembly comprising:
      a detector configured to receive light diffracted by the semiconductor device and determine a measurement of a periodic structure within the semiconductor device based on the received diffracted light; and
      a diffraction pattern filter configured to permit light diffracted by the periodic structure to be measured to reach the detector and block at least a portion of light diffracted by other structures in the semiconductor device from reaching the detector;
   wherein the diffraction filter comprises a diffraction blocking pattern of a light-absorbing material located on or in an optically transparent matrix, wherein the diffraction blocking pattern corresponds to a pattern of light diffracted by the other structures in the semiconductor device at a location within the detection assembly at which the diffraction pattern filter is positioned;
   wherein the two-dimensional periodic array of discrete light-absorbing material portions comprises a two-dimensional periodic array of a unit grayscale light-absorbing material pattern;
   wherein the unit grayscale light-absorbing material pattern comprises a concentric pattern in which light absorption decreases radially with a distance from a geometrical center of the concentric pattern.

2. The measurement apparatus of claim 1, wherein the two-dimensional periodic array of discrete light-absorbing material portions comprises a two-dimensional periodic array of a light-absorbing material pattern.

3. The measurement apparatus of claim 1, wherein:
   the detection assembly further comprises a lens; and
   the diffraction pattern filter is positioned between the lens and the detector.

4. The measurement apparatus of claim 1, wherein:
   the semiconductor device is an in-process three-dimensional memory device in which three-dimensional memory structures are formed over an underlying array of complementary metal-oxide-semiconductor (CMOS) devices formed on a semiconductor substrate;
   the periodic structure to be measured comprises a two-dimensional array of vertical stacks of memory elements; and the other structures comprise the underlying array of CMOS devices.

5. A method of measuring a dimension of a periodic structure of a semiconductor device using an optical nanoscale-dimension measurement apparatus, comprising:
placing a diffraction pattern filter within a detection assembly of the optical nanoscale dimension measurement apparatus, wherein the diffraction pattern filter is configured to permit light diffracted by the periodic structure to reach a detector within the detection assembly and block at least a portion of light diffracted by other structures in the semiconductor device from reaching the detector;
illuminating the semiconductor device with light so that light diffracted from the semiconductor device is received by the detection assembly; and
measuring at least one dimension of the periodic structure of the semiconductor device based on a diffraction pattern in the light diffracted from the semiconductor device;
wherein measuring the at least one dimension of the periodic structure of the semiconductor device comprises measuring an average lateral dimension of unit geometrical features within the periodic structure of the semiconductor device;
wherein:
the semiconductor device is an in-process three-dimensional memory device in which three-dimensional memory structures are formed over an underlying array of complementary metal-oxide-semiconductor (CMOS) devices formed on a semiconductor substrate;
the other structures comprise complementary metal-oxide-semiconductor (CMOS) devices located on a silicon layer;
the CMOS devices comprises peripheral devices for a three-dimensional memory array;
the periodic structure of the semiconductor device comprises a two-dimensional array of vertically-extending openings; and
measuring the average lateral dimension of unit geometrical features within the periodic structure of the semiconductor device comprises measuring an average lateral dimension of the two-dimensional array of vertically-extending openings along a horizontal direction.

6. A method of making a diffraction pattern filter for use in an optical nanoscale-dimension measurement apparatus, comprising:
determining, at a position within a detection assembly of the optical nanoscale-dimension measurement apparatus of the diffraction pattern filter, a first diffraction pattern of light diffracted from a semiconductor device that includes a diffraction pattern of light diffracted from periodic structure to be measured and a diffraction pattern of light diffracted from other structures;
determining, at the position within the detection assembly of the optical nanoscale-dimension measurement apparatus of the diffraction pattern filter, a second diffraction pattern of light diffracted from a semiconductor device that includes the diffraction pattern of light diffracted from the periodic structure to be measured but not from other structures;
generating a difference diffraction pattern by subtracting the second diffraction pattern from the first diffraction pattern; and
forming the diffraction pattern filter by placing opaque material on or within a transparent medium at locations corresponding to the generated difference diffraction pattern;
wherein forming the diffraction pattern filter by placing opaque materials on or within a transparent medium at locations corresponding to the generated difference diffraction pattern comprises:
determining a map where the difference diffraction pattern exhibits an intensity that exceeds a threshold, the threshold being greater than 1% of a maximum intensity of the difference diffraction pattern; and
replicating the map when placing opaque materials on or within a transparent medium at locations corresponding to the generated difference diffraction pattern.

7. A method of making a diffraction pattern filter for use in an optical nanoscale-dimension measurement apparatus, comprising:
determining, at a position within a detection assembly of the optical nanoscale-dimension measurement apparatus of the diffraction pattern filter, a first diffraction pattern of light diffracted from a semiconductor device that includes a diffraction pattern of light diffracted from periodic structure to be measured and a diffraction pattern of light diffracted from other structures;
determining, at the position within the detection assembly of the optical nanoscale-dimension measurement apparatus of the diffraction pattern filter, a second diffraction pattern of light diffracted from a semiconductor device that includes the diffraction pattern of light diffracted from the periodic structure to be measured but not from other structures;
generating a difference diffraction pattern by subtracting the second diffraction pattern from the first diffraction pattern; and
forming the diffraction pattern filter by placing opaque material on or within a transparent medium at locations corresponding to the generated difference diffraction pattern;
wherein placing opaque material on or within the transparent medium at locations corresponding to the generated difference diffraction pattern comprises applying a grayscale light-absorbing material pattern on or within the transparent medium; and
wherein the unit grayscale light-absorbing material pattern comprises a concentric pattern in which light absorption decreases radially with a distance from a geometrical center of the concentric pattern.

8. The method of claim 6, wherein:
the semiconductor device is an in-process three-dimensional memory device in which three-dimensional memory structures are formed over an underlying array of complementary metal-oxide-semiconductor (CMOS) devices formed on a semiconductor substrate;
the other structures comprise complementary metal-oxide-semiconductor (CMOS) devices located on a silicon layer;
the CMOS devices comprises peripheral devices for a three-dimensional memory array.

9. The method of claim 7, wherein:
the semiconductor device is an in-process three-dimensional memory device in which three-dimensional memory structures are formed over an underlying array of complementary metal-oxide-semiconductor (CMOS) devices formed on a semiconductor substrate;

the other structures comprise complementary metal-oxide-semiconductor (CMOS) devices located on a silicon layer;

the CMOS devices comprises peripheral devices for a three-dimensional memory array.

* * * * *